US010636681B2

(12) United States Patent
Kamimura et al.

(10) Patent No.: US 10,636,681 B2
(45) Date of Patent: Apr. 28, 2020

(54) SUBSTRATE PROCESSING APPARATUS AND METHOD OF MANUFACTURING SEMICONDUCTOR DEVICE

(71) Applicant: KOKUSAI ELECTRIC CORPORATION, Tokyo (JP)

(72) Inventors: Daigi Kamimura, Toyama (JP); Tomoshi Taniyama, Toyama (JP); Takashi Nogami, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/234,972

(22) Filed: Dec. 28, 2018

(65) Prior Publication Data
US 2019/0198359 A1     Jun. 27, 2019

Related U.S. Application Data

(63) Continuation of application No. PCT/JP2016/069486, filed on Jun. 30, 2016.

(51) Int. Cl.
  *H01L 21/67*  (2006.01)
  *H01L 21/02*  (2006.01)
  *H01L 21/677* (2006.01)

(52) U.S. Cl.
  CPC ........ *H01L 21/67017* (2013.01); *H01L 21/02* (2013.01); *H01L 21/6719* (2013.01);
  (Continued)

(58) Field of Classification Search
  None
  See application file for complete search history.

(56) References Cited

U.S. PATENT DOCUMENTS 7,371,998 B2    5/2008  Harris et al.
7,553,516 B2    6/2009  Selen et al.
                        (Continued)

FOREIGN PATENT DOCUMENTS

JP     11-204449 A    7/1999
JP   2001-023872 A    1/2001
                        (Continued)

OTHER PUBLICATIONS

International Search Report dated Sep. 13, 2016 for PCT International Application No. PCT/JP2016/069486.
(Continued)

*Primary Examiner* — Karla A Moore
(74) *Attorney, Agent, or Firm* — Volpe and Koenig, P.C.

(57) ABSTRACT

A substrate processing apparatus includes a first processing module including a first processing module, a second processing module, a first utility system adjacent to a back surface of the first processing module, and a second utility system adjacent to a back surface of the second processing module, a first exhaust box of the first utility system and a second exhaust box of the second utility system being disposed to face each other across a maintenance area located behind a part of the back surface of the first processing module that is close to the second processing module and behind a part of the back surface of the second processing module that is close to the first processing module, and a first supply box of the first utility system and a second supply box of the second utility system being disposed to face each other across the maintenance area.

17 Claims, 5 Drawing Sheets

(52) U.S. Cl.
CPC .. *H01L 21/67109* (2013.01); *H01L 21/67178* (2013.01); *H01L 21/67184* (2013.01); *H01L 21/67196* (2013.01); *H01L 21/67757* (2013.01)

(56) References Cited

U.S. PATENT DOCUMENTS

| | | | |
|---|---|---|---|
| 7,833,351 B2 | 11/2010 | Webb et al. | |
| 2005/0027387 A1 | 2/2005 | Fujishima | |
| 2006/0174829 A1 | 8/2006 | An et al. | |
| 2008/0236488 A1 | 10/2008 | Takeshita et al. | |
| 2013/0137279 A1* | 5/2013 | Yamamoto | H01L 21/02225 438/778 |

FOREIGN PATENT DOCUMENTS

| | | | |
|---|---|---|---|
| JP | 2001-210602 A | | 8/2001 |
| JP | 2002-170781 A | | 6/2002 |
| JP | 2002170781 A | * | 6/2002 |
| JP | 2004-014984 A | | 1/2004 |
| JP | 2005-051089 A | | 2/2005 |
| JP | 2010-283356 A | | 12/2010 |
| KR | 10-2006-0097185 A | | 9/2006 |

OTHER PUBLICATIONS

Korean Office Action dated Dec. 4, 2018 in the Korean Application No. 10-2018-7027056.
Korean Office Action dated Dec. 4, 2018 in the Korean Application No. 10-2018-7027064.
Korean Office Action dated Dec. 4, 2018 in the Korean Application No. 10-2018-7027068.
Korean Office Action dated Dec. 4, 2018 in the Korean Application No. 10-2018-7027070.
Korean Office Action dated Dec. 4, 2018 in the Korean Application No. 10-2018-7027066.

* cited by examiner

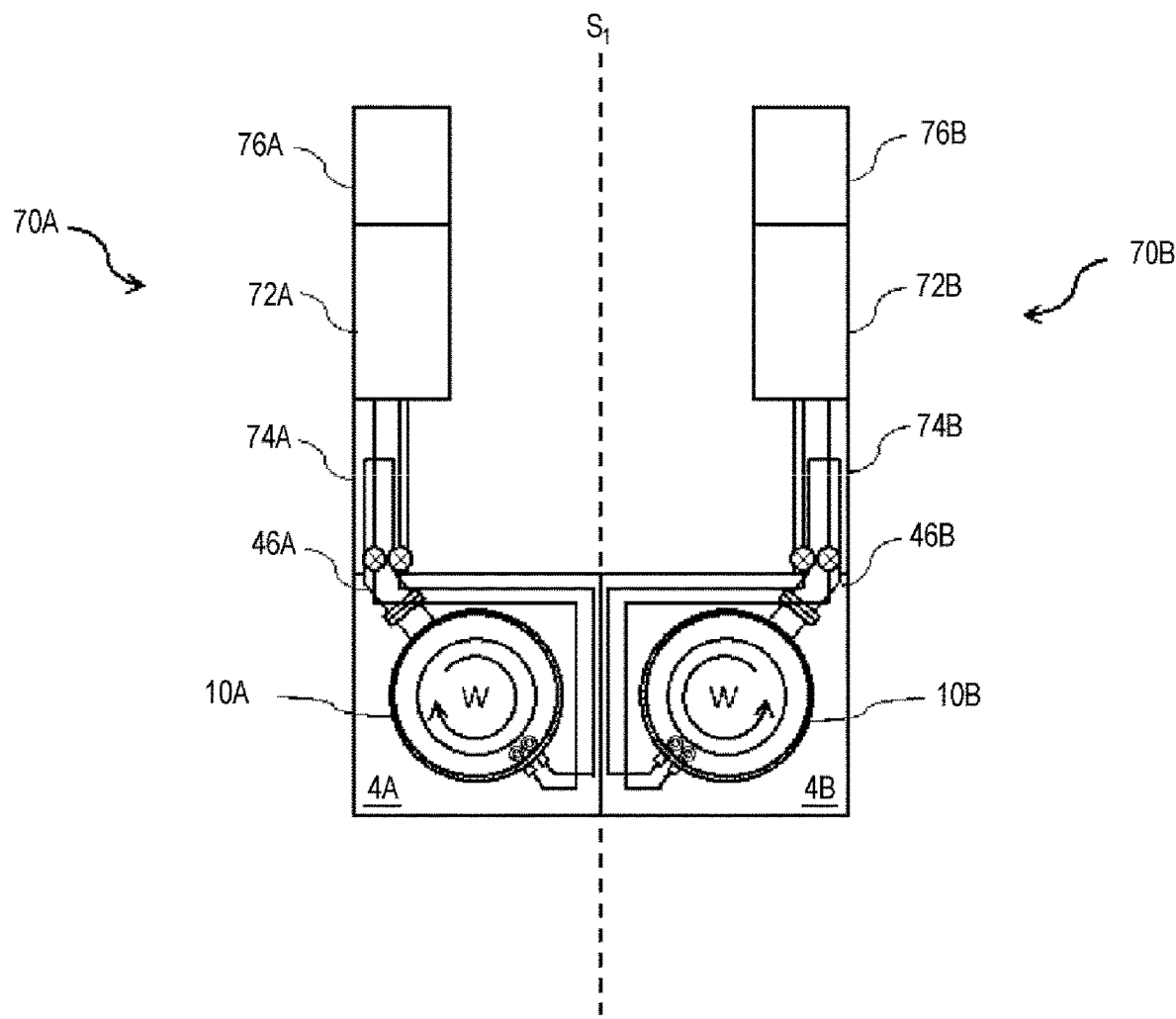

SUBSTRATE PROCESSING APPARATUS AND METHOD OF MANUFACTURING SEMICONDUCTOR DEVICE

CROSS-REFERENCE TO RELATED APPLICATION

This application is a Bypass Continuation Application of PCT international Application No. PCT/JP2016/069486, filed on Jun. 30, 2016, the entire contents of which are incorporated herein by reference.

TECHNICAL FIELD

The present disclosure relates to a substrate processing apparatus and a method of manufacturing a semiconductor device.

BACKGROUND

When processing a substrate in a process of manufacturing a semiconductor device, for example, a vertical substrate processing apparatus for processing a plurality of substrates at one time is used. At the time of maintenance of the substrate processing apparatus, it is necessary to secure a maintenance area around the substrate processing apparatus. In order to secure the maintenance area, the footprint of the substrate processing apparatus may become large in some cases.

The present disclosure provides some embodiments of a technique capable of reducing a footprint while securing a maintenance area.

SUMMARY

According to one embodiment of the present disclosure, there is provided a technique, including: a first processing module including a first processing container in which a substrate is processed; a second processing module including a second processing container, in which the substrate is processed, disposed adjacent to the first processing container; a first utility system disposed adjacent to a back surface of the first processing module and including: a first exhaust box for accommodating a first exhaust system configured to evacuate an inside of the first processing container; and a first supply box for accommodating a first supply system configured to supply a processing gas into the first processing container; and a second utility system disposed adjacent to a back surface of the second processing module and including: a second exhaust box for accommodating a second exhaust system configured to evacuate an inside of the second processing container; and a second supply box for accommodating a second supply system configured to supply a processing gas into the second processing container, wherein the first exhaust box and the second exhaust box are disposed to face each other across a maintenance area, which is located behind a first part of the back surface of the first processing module that is close to the second processing module and behind a first part of the back surface of the second processing module that is close to the first processing module, and the first supply box and the second supply box are disposed to face each other across the maintenance area.

According to the present disclosure, it is possible to reduce a footprint while securing a maintenance area.

BRIEF DESCRIPTION OF DRAWINGS

FIG. 5 is a horizontal sectional view schematically showing an example of a processing module suitably used in an embodiment of the present disclosure.

DETAILED DESCRIPTION

Figure 1:
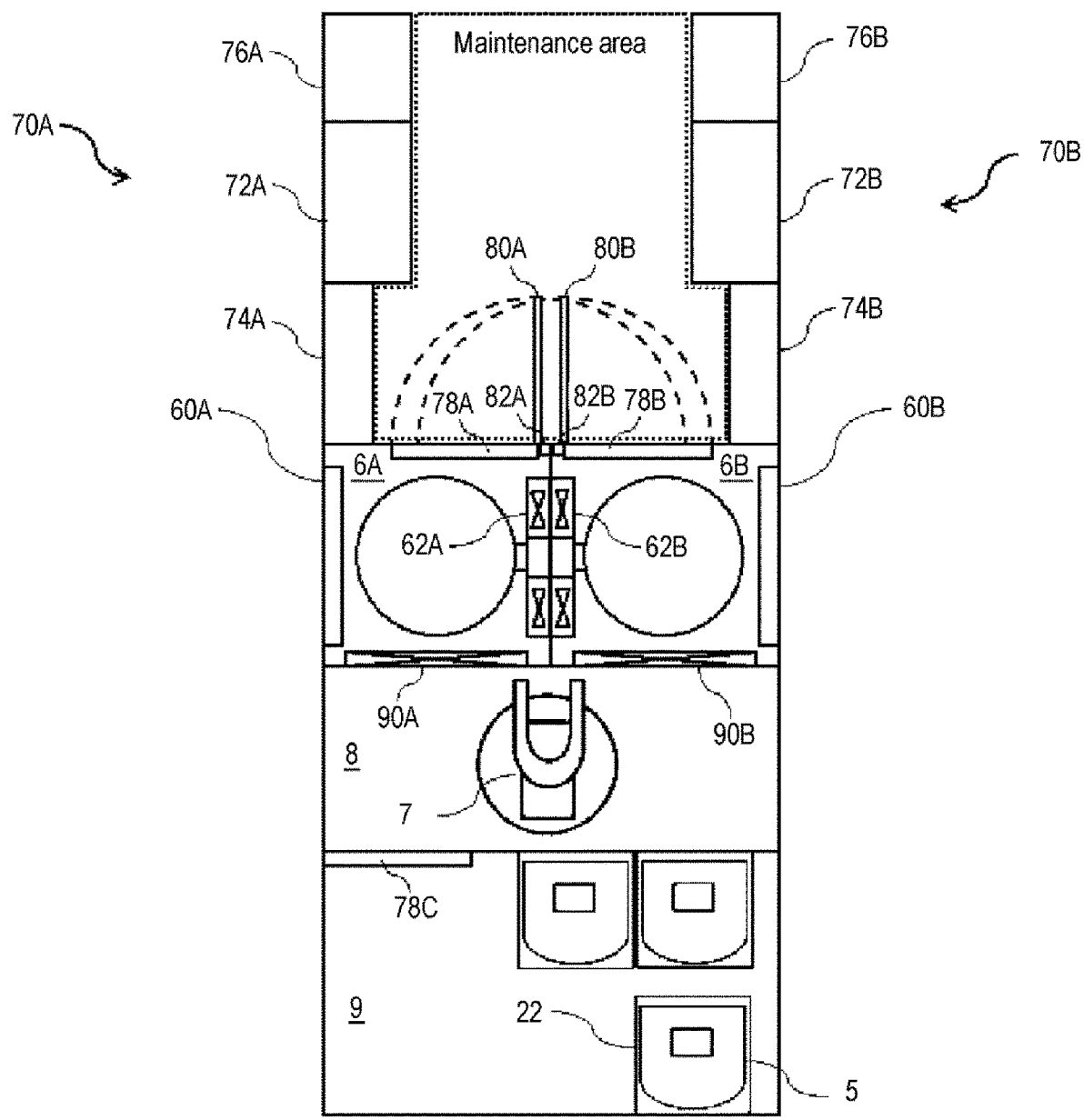
FIG. 1 is a top view schematically showing an example of a substrate processing apparatus suitably used in an embodiment of the present disclosure.

A non-limiting exemplary embodiment of the present disclosure will now be described with reference to the drawings. Throughout the drawings, the same or corresponding components are denoted by the same or corresponding reference numerals, and redundant description thereof will be omitted. Furthermore, the side of a storage chamber 9 to be described later is referred to as a front side, and the side of transfer chambers 6A and 6B to be described later is referred to as a back side. In addition, the side facing a boundary line (adjacent surface) of processing modules 3A and 3B to be described later is referred to as an inside, and the side away from the boundary line is referred to as an outside.

In the present embodiment, the substrate processing apparatus is configured as a vertical substrate processing apparatus (hereinafter referred to as a processing apparatus) 2 that performs a substrate processing process such as a heat treatment or the like as one manufacturing process in a method of manufacturing a semiconductor device.

Figure 2:
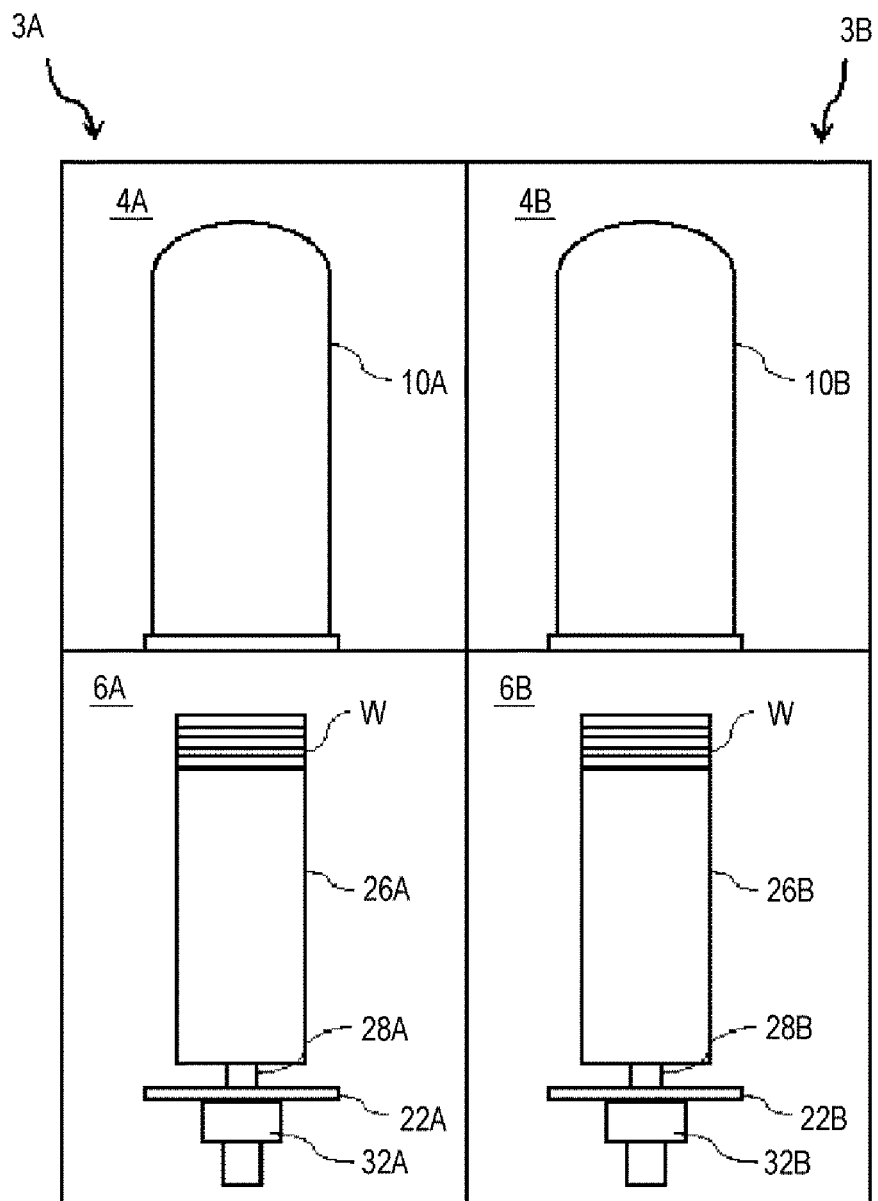
FIG. 2 is a vertical sectional view schematically showing an example of a substrate processing apparatus suitably used in an embodiment of the present disclosure.

As shown in FIGS. 1 and 2, the processing apparatus 2 includes two adjacent processing modules 3A and 3B. The processing module 3A includes a process furnace 4A and a transfer chamber 6A. The processing module 3B includes a process furnace 4B and a transfer chamber 6B. The transfer chambers 6A and 6B are disposed under the process furnaces 4A and 4B, respectively. A transshipment chamber 8 is disposed adjacent to the front side of the transfer chambers 6A and 6B and equipped with a transshipment device (transfer robot) 7 for transshipping a wafer W. A storage chamber 9 that stores a pod (FOUP) 5 for accommodating a plurality of wafers W is connected to the front side of the transshipment chamber 8. An I/O port 22 is installed on the entire surface of the storage chamber 9, and the pod 5 is loaded into and unloaded from the processing apparatus 2 via the I/O port 22.

On the boundary walls (adjacent surfaces) between the transfer chambers 6A and 6B and the transshipment chamber 8, gate valves 90A and 90B are respectively installed. Pressure detectors are installed in the transshipment chamber 8 and in the transfer chambers 6A and 6B, respectively. The pressure in the transshipment chamber 8 is set lower than the pressure in the transfer chambers 6A and 6B. Oxygen concentration detectors are installed in the transshipment chamber 8 and in the transfer chambers 6A and 6B, respectively. The oxygen concentrations in the transshipment chamber 8 and in the transfer chambers 6A and 6B are kept lower than the oxygen concentration in the atmosphere.

At the ceiling of the transshipment chamber 8, there is installed a clean unit 62C for supplying a clean air into the transshipment chamber 8. The clean unit 62C is configured to circulate a filtrated air, for example, an inert gas in the transshipment chamber 8. By purging the interior of the transshipment chamber 8 with a circulating inert gas, it is possible to keep the interior of the transshipment chamber 8 in a clean atmosphere. With such a configuration, it is possible to prevent particles and the like present in the transfer chambers 6A and 6B from entering the transshipment chamber 8. This makes it possible to prevent a natural oxide film from being formed on a wafer W in the transshipment chamber 8 and the transfer chambers 6A and 6B.

Since the processing module 3A and the processing module 3B have the same configuration, only the processing module 3A will be representatively described below.

Figure 4:
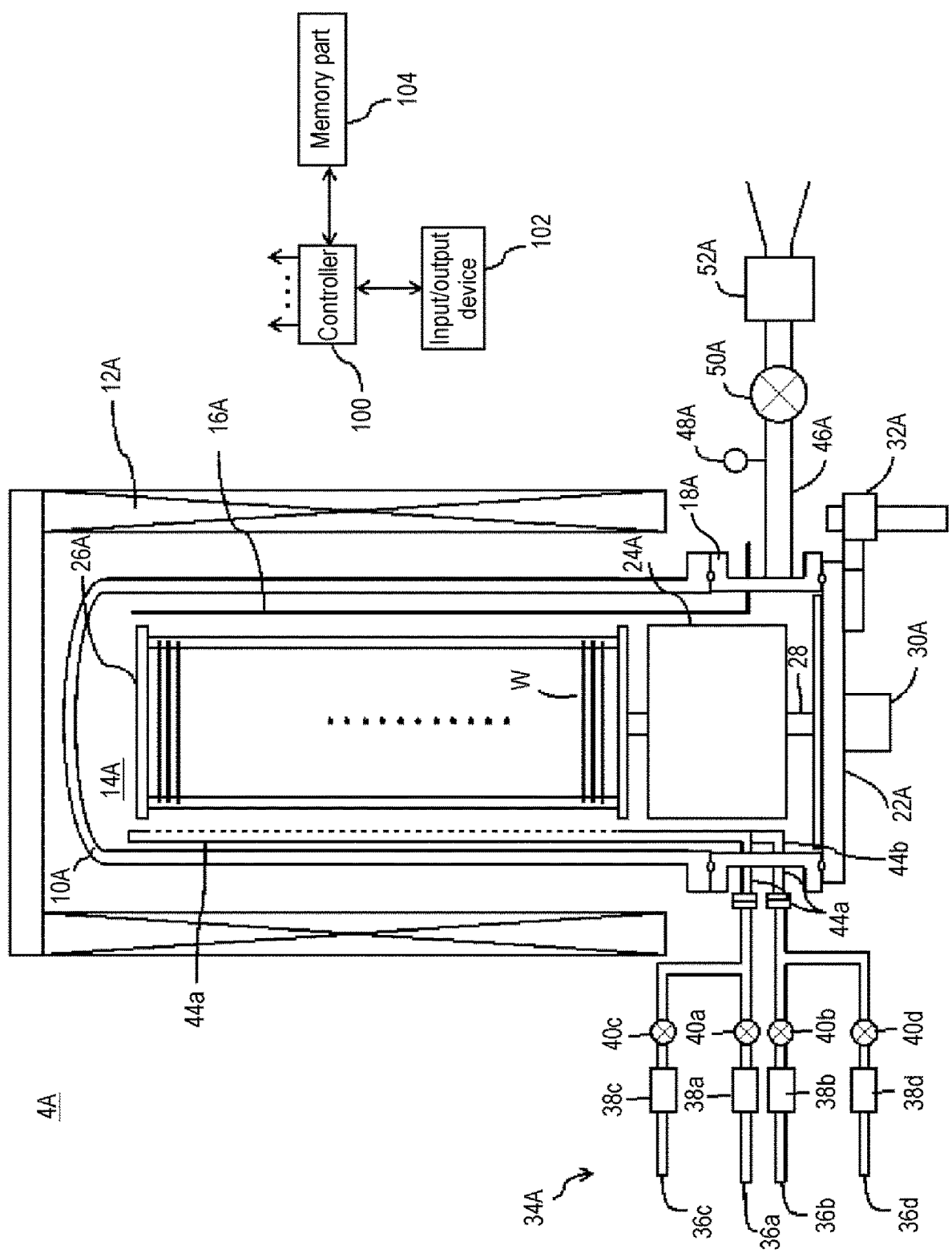
FIG. 4 is a vertical sectional view schematically showing an example of a process furnace suitably used in an embodiment of the present disclosure.

As shown in FIG. 4, the process furnace 4A includes a cylindrical reaction tube 10A and a heater 12A as a heating means (heating mechanism) installed around the reaction tube 10A. The reaction tube 10A is formed of, for example, quartz or SiC. Inside the reaction tube 10A, a process chamber 14A for processing a wafer W as a substrate is formed. A temperature detection part 16A as a temperature detector is installed in the reaction tube 10A. The temperature detection part 16A is vertically installed along the inner wall of the reaction tube 10A.

A gas used for substrate processing is supplied into the process chamber 14A by a gas supply mechanism 34A as a gas supply system. The gas supplied by the gas supply mechanism 34A is changed depending on the type of the film to be formed. The gas supply mechanism 34A includes a precursor gas supply part, a reaction gas supply part and an inert gas supply part. The gas supply mechanism 34A is housed in a supply box 72A to be described later.

The precursor gas supply part includes a gas supply pipe 36$a$. A mass flow controller (MFC) 38$a$ as a flow rate controller (flow rate control part) and a valve 40$a$ as an on-off valve are installed at the gas supply pipe 36$a$ sequentially from the upstream side. The gas supply pipe 36$a$ is connected to a nozzle 44$a$ extending through a side wall of a manifold 18A. The nozzle 44$a$ is installed upright along the vertical direction within the reaction tube 10A and has a plurality of supply holes opened toward the wafers W held by a boat 26A. A precursor gas is supplied to the wafer W through the supply holes of the nozzle 44$a$.

With the same configuration, a reaction gas is supplied from the reaction gas supply part to the wafer W via a gas supply pipe 36$b$, a MFC 38$b$, a valve 40$b$ and a nozzle 44$b$. An inert gas is supplied from the inert gas supply part to the wafer W via gas supply pipes 36$c$ and 36$d$, MFCs 38$c$ and 38$d$, valves 40$c$ and 40$d$, and nozzles 44$a$ and 44$b$.

The cylindrical manifold 18A is connected to the lower end opening of the reaction tube 10A via a sealing member such as an O ring or the like to support the lower end of the reaction tube 10A. The lower end opening of the manifold 18A is opened and closed by a disk-shaped lid 22A. A sealing member such as an O-ring or the like is installed on the upper surface of the lid 22A, whereby the interior of the reaction tube 10A is hermetically sealed against the external air. A heat insulating part 24A is placed on the lid 22A.

An exhaust pipe 46A is attached to the manifold 18A. A vacuum pump 52A as a vacuum exhaust device is connected to the exhaust pipe 46A via a pressure sensor 48A as a pressure detector (pressure detection part) for detecting the pressure in the process chamber 14A and an APC (Auto Pressure Controller) valve 50A as a pressure regulator (pressure regulation part). With such a configuration, the pressure in the process chamber 14A may be set to a processing pressure depending on the process. An exhaust system A is mainly constituted by the exhaust pipe 46A, the APC valve 50A and the pressure sensor 48A. The exhaust system A is housed in an exhaust box 74A to be described later.

The process chamber 14A accommodates therein a boat 26A as a substrate holder for vertically holding a plurality of wafers W, for example, 25 to 150 wafers W in a shelf shape. The boat 26A is supported above the heat insulating part 24A by a rotating shaft 28A extending through the lid 22A and the heat insulating part 24A. The rotating shaft 28A is connected to a rotation mechanism 30A installed below the lid 22A. The rotating shaft 28A is configured to be rotatable while hermetically sealing the inside of the reaction tube 10A. The lid 22A is vertically driven by a boat elevator 32A as an elevating mechanism. As a result, the boat 26A and the lid 22A are raised and lowered integrally, and the boat 26A is loaded into and unloaded from the reaction tube 10A.

The boat 26B is supported by a rotating shaft 28B extending through a lid 22B. The rotating shaft 28B is connected to a rotation mechanism installed below the lid 22B. The rotating shaft 28B is configured to be rotatable while hermetically sealing the inside of the reaction tube 10B. The lid 22B is vertically driven by a boat elevator 32B as an elevating mechanism. As a result, the boat 26B and the lid 22B are raised and lowered integrally, and the boat 26B is loaded into and unloaded from the reaction tube 10B.

Figure 3:
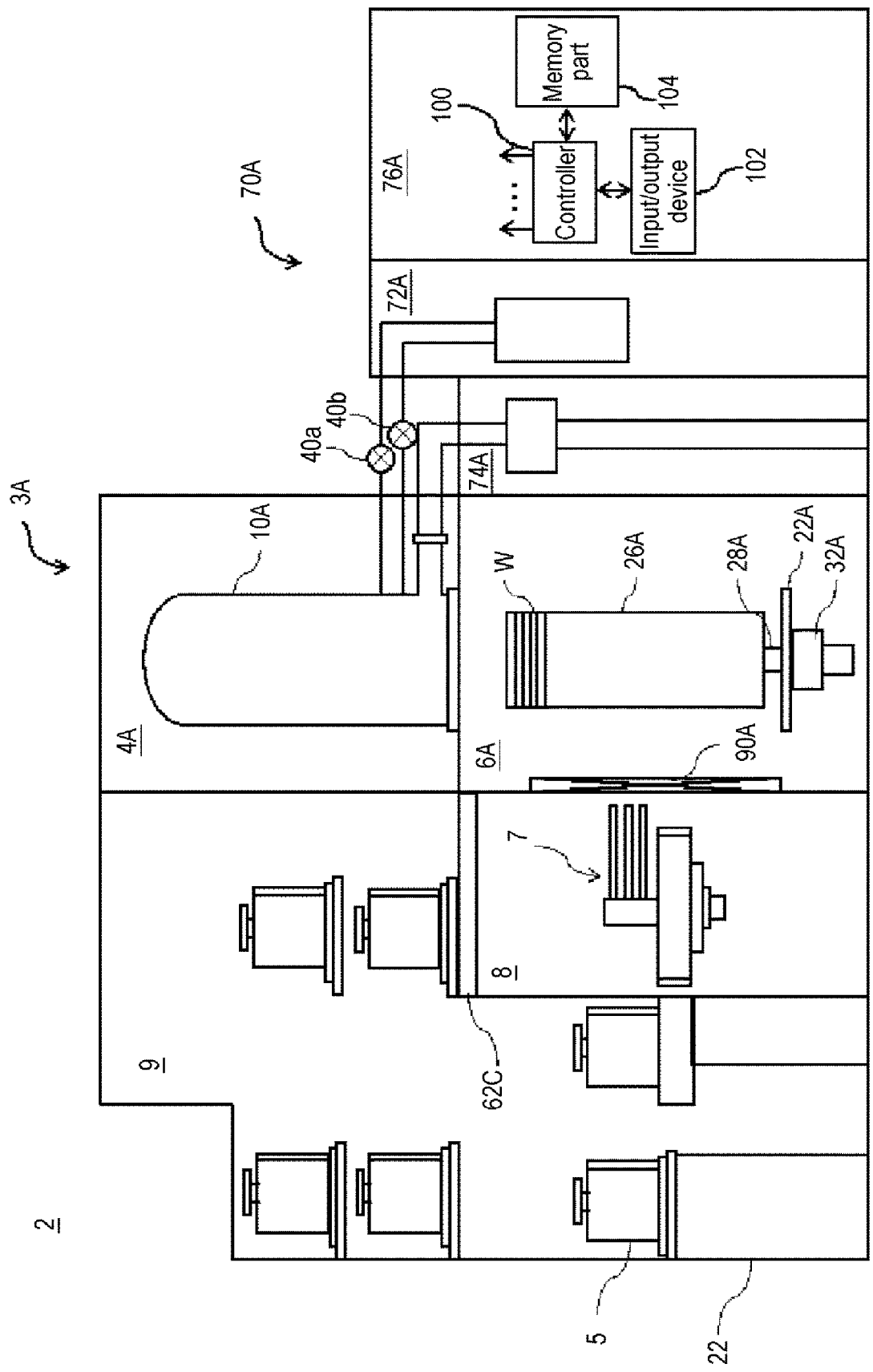
FIG. 3 is a vertical cross-sectional view schematically showing an example of a substrate processing apparatus suitably used in an embodiment of the present disclosure.

The transshipment of the wafer W to the boat 26A is performed in the transfer chamber 6A. As shown in FIG. 3, a clean unit 60A is installed on one side surface in the transfer chamber 6A (the outer side surface of the transfer chamber 6A or the side surface opposite to the side surface facing the transfer chamber 6B) and a clean unit 60B is installed on one side surface in the transfer chamber 6B (the outer side surface of the transfer chamber 6B or the side surface opposite to the side surface facing the transfer chamber 6A). The clean unit 60A is configured to circulate a clean air (for example, an inert gas) in the transfer chamber 6A and the clean unit 60B is configured to circulate a clean air (for example, an inert gas) in the transfer chamber 6B. The inert gas supplied into the transfer chamber 6A is exhausted from the inside of the transfer chamber 6A by an exhaust part 62A installed on the side surface facing the clean unit 60A across the boat 26A (the side surface facing the transfer chamber 6B) and is re-supplied from the clean unit 60A into the transfer chamber 6A (circulation purge). The inert gas supplied into the transfer chamber 6B is exhausted from the inside of the transfer chamber 6B by an exhaust part 62B installed on the side surface facing the clean unit 60B across the boat 26B (the side surface facing the transfer chamber 6A) and is re-supplied from the clean unit 60B into the transfer chamber 6B (circulation purge). The pressure in the transfer chamber 6A or 6B is set to be lower than the pressure in the transshipment chamber 8. Further, the oxygen concentration in the transfer chamber 6A or 6B is set to be lower than the oxygen concentration in the atmosphere. With such a configuration, it is possible to suppress the formation of a natural oxide film on the wafer W during the transfer operation of the wafer W.

A controller 100 is connected to the rotation mechanism 30A, the boat elevator 32A, the MFCs 38$a$ to 38$d$ and the valves 40$a$ to 40$d$ of the gas supply mechanism 34A, and the APC valve 50A. The controller 100 is composed of, for example, a microprocessor (computer) having a CPU and is configured to control the operation of the processing apparatus 2. An input/output device 102 configured as, for example, a touch panel or the like is connected to the controller 100. The controller 100 may be installed for each of the processing module 3A and the processing module 3B, or one controller 100 may be installed in common in the processing module 3A and the processing module 3B.

A memory part 104 as a memory medium is connected to the controller 100. In the memory part 104, a control program for controlling the operation of the processing apparatus 2 and a program (also referred to as a recipe) for causing each component of the processing apparatus 2 to execute a process in accordance with processing conditions are readably stored.

The memory part 104 may be a memory device (a hard disk or a flash memory) incorporated in the controller 100, or may be a portable external recording device (a magnetic tape, a magnetic disk such as a flexible disk or a hard disk, an optical disk such as a CD or a DVD, a magneto-optical disk such as an MO or the like, or a semiconductor memory such as a USB memory or a memory card). In addition, the provision of the program to the computer may be performed by using a communication means such as the Internet or a dedicated line. If necessary, the program is read out from the memory part 104 in response to an instruction from the input/output device 102, etc. The controller 100 executes a process according to the read recipe so that the processing apparatus 2 can execute a desired process under the control of the controller 100. The controller 100 is stored in controller boxes 76A and 76B.

Next, a process (film-forming process) for forming a film on a substrate by using the above-described processing apparatus 2 will be described. Description will be made on an example where a silicon oxide ($SiO_2$) film is formed by supplying a DCS ($SiH_2Cl_2$; dichlorosilane) gas as a precursor gas and an $O_2$ (oxygen) gas as a reaction gas to the wafer W. In the following description, the operations of the respective parts constituting the processing apparatus 2 are controlled by the controller 100.

(Wafer Charging and Boat Loading)

The gate valve 90A is opened and the wafer W is transferred to the boat 26A. When a plurality of wafers W is loaded into the boat 26A (wafer charging), the gate valve 90A is closed. The boat 26A is loaded into the process chamber 14A by the boat elevator 32A (boat loading), and the lower opening of the reaction tube 10A is airtightly closed (sealed) by the lid 22A.

(Pressure Regulation and Temperature Adjustment)

The inside of the process chamber 14A is evacuated into vacuum (evacuated into reduced pressure) by the vacuum pump 52A so as to have a predetermined pressure (vacuum degree). The pressure in the process chamber 14A is measured by the pressure sensor 48A, and the APC valve 50A is feedback-controlled based on the measured pressure information. Furthermore, the wafer W in the process chamber 14A is heated by the heater 12A so as to have a predetermined temperature. At this time, the supply of electric power to the heater 12A is feedback-controlled based on the temperature information detected by the temperature detection part 16A so that the process chamber 14A has a predetermined temperature distribution. In addition, the rotation of the boat 26A and the wafers W by the rotation mechanism 30A is started.

(Film-Forming Process)

An $SiO_2$ film having a predetermined composition and a predetermined film thickness can be formed on the wafer W by performing a cycle of four steps as descried below a predetermined number of times (one or more times).

[Precursor Gas Supply Step]

When the temperature in the process chamber 14A becomes stable at a preset processing temperature, a DCS gas is supplied to the wafers W in the process chamber 14A. The DCS gas is controlled to have a desired flow rate by the MFC 38a and is supplied into the process chamber 14A via the gas supply pipe 36a and the nozzle 44a.

[Precursor Gas Exhaust Step]

Next, the supply of the DCS gas is stopped, and the interior of the process chamber 14A is evacuated into vacuum by the vacuum pump 52A. At this time, an $N_2$ gas as inert gas may be supplied from the inert gas supply part into the process chamber 14A (inert gas purge).

[Reaction Gas Supply Step]

Next, an $O_2$ gas is supplied to the wafers W in the process chamber 14A. The $O_2$ gas is controlled to have a desired flow rate by the MFC 38b and is supplied into the process chamber 14A via the gas supply pipe 36b and the nozzle 44b.

[Reaction Gas Exhaust Step]

Next, the supply of the $O_2$ gas is stopped, and the interior of the process chamber 14A is evacuated into vacuum by the vacuum pump 52A. At this time, an $N_2$ gas may be supplied from the inert gas supply part into the process chamber 14A (inert gas purge).

(Boat Unloading and Wafer Discharging)

After forming a film having a predetermined film thickness, an $N_2$ gas is supplied from the inert gas supply part, the inside of the process chamber 14A is replaced with the $N_2$ gas, and the pressure in the process chamber 14A is restored to the atmospheric pressure. Thereafter, the lid 22A is lowered by the boat elevator 32A, and the boat 26A is unloaded from the reaction tube 10A (boat unloading). Thereafter, the processed wafers W are taken out from the boat 26A (wafer discharging).

Thereafter, the wafers W may be stored in the pod 5 and unloaded to the outside of the processing apparatus 2, or may be transferred to the process furnace 4B so that substrate processing such as, for example, annealing or the like can be continuously performed. When continuously processing the wafers W in the process furnace 4B after the processing of the wafers W in the process furnace 4A, the gate valves 90A and 90B are opened, and the wafers W are directly transferred from the boat 26A to the boat 26B. The subsequent loading and unloading of the wafers W into and from the process furnace 4B is performed in the same procedure as the substrate processing performed by the process furnace 4A described above. Furthermore, the substrate processing in the process furnace 4B is performed, for example, in the same procedure as the substrate processing performed by the process furnace 4A described above.

As the processing conditions used when forming the $SiO_2$ film on the wafer W, for example, the following is exemplified.

Processing temperature (wafer temperature): 300 degrees C. to 700 degrees C.

Processing pressure (pressure in the process chamber): 1 Pa to 4,000 Pa,

DCS gas: 100 sccm to 10,000 sccm, $O_2$ gas: 100 sccm to 10,000 sccm, $N_2$ gas: 100 sccm to 10,000 sccm, By setting the respective processing conditions within the respective ranges, it becomes possible to appropriately perform the film-forming process. Besides, prior to the Film-Forming Process, a conditioning process such as hydrogen termination (hydrophobization), hydroxyl termination (hydrophilization), oxidation, nitridation or the like may be carried out so as to form adsorption sites or reaction sites on the surface of the wafer W at an adequate density.

Next, the rear structure of the processing apparatus 2 will be described. For example, when the boat 26A or 26B is broken, it is necessary to replace the boat 26A or 26B. In addition, when the reaction tube 10A or 10B is broken or when the reaction tube 10A or 10B needs to be cleaned, it is necessary to remove the reaction tube 10A or 10B. In this way, when carrying out maintenance in the transfer chamber 6A or 6B or the process furnace 4A or 4B, the maintenance is performed from a maintenance area located behind the back side of the processing apparatus 2.

As shown in FIG. 1, maintenance ports 78A and 78B are formed on the back sides of the transfer chambers 6A and 6B, respectively. The maintenance port 78A is formed on the back of the transfer chamber 6A close to the transfer chamber 6B, and the maintenance port 78B is formed on the back of the transfer chamber 6B close to the transfer chamber 6A. The maintenance ports 78A and 78B are opened and closed by maintenance doors 80A and 80B. The maintenance doors 80A and 80B are configured to be rotatable about hinges 82A and 82B as base axes. The hinge 82A is installed on the transfer chamber 6B side of the transfer chamber 6A, and the hinge 82B is installed on the transfer chamber 6A side of the transfer chamber 6B. That is, the hinges 82A and 82B are installed adjacent to each other in the vicinity of the inner corners of the adjacent surfaces and the back sides of the transfer chambers 6A and 6B. A maintenance area is formed behind a part (first part) of the back side of the processing module 3A that is close to the processing module 3B and behind a part (first part) of the back side of the processing module 3B that is close to the processing module 3A.

As shown by phantom lines, the maintenance doors 80A and 80B are horizontally rotated about the hinges 82A and 82B to the back sides of the transfer chambers 6A and 6B, whereby the maintenance ports 78A and 78B are opened. The maintenance door 80A is configured to open left and outward by at least 90 degrees, preferably up to 180 degrees. The maintenance door 80B is configured to open right and outward by at least 90 degrees, preferably up to 180 degrees. That is, the maintenance door 80A rotates clockwise toward the transfer chamber 6A, and the maintenance door 80B rotates counterclockwise toward the transfer chamber 6B. In other words, the maintenance doors 80A and 80B are rotated in opposite directions. The maintenance doors 80A and 80B may be configured to be removable for maintenance.

Utility systems 70A and 70B are installed in the vicinity of the back surfaces of the transfer chambers 6A and 6B. In some instances, the utility system 70A faces or is connected with a part (second part) of the back surface of the processing module 3A opposite to the processing module 3B. Further, the utility system 70B faces or is connected with a part (second part) of the back surface of the processing module 3B opposite to the processing module 3A. The utility systems 70A and 70B are arranged to face each other across the maintenance area interposed therebetween. The maintenance of the utility systems 70A and 70B is performed from the space (maintenance area) inside the utility systems 70A and 70B, i.e., between the utility systems 70A and 70B. The utility systems 70A and 70B are composed of exhaust boxes 74A and 74B, supply boxes 72A and 72B, and controller boxes 76A and 76B arranged sequentially from the housing side (the transfer chambers 6A and 6B side). Maintenance ports of the respective boxes of the utility systems 70A and 70B are formed on the inner side (close to the maintenance area). That is, the maintenance ports of the respective boxes of the utility systems 70A and 70B are formed to face each other.

The exhaust box 74A is disposed behind a part of the back surface of the transfer chamber 6A and adjoining to an outer corner of the transfer chamber 6A opposite to the transfer chamber 6B. The exhaust box 74B is disposed behind a part of the back side of the transfer chamber 6B and adjoining to an outer corner of the transfer chamber 6B opposite to the transfer chamber 6A. That is, the exhaust boxes 74A and 74B are installed flat (smoothly) such that the outer side surfaces of the transfer chambers 6A and 6B and the outer side surfaces of the exhaust boxes 74A and 74B are connected to be flush (in plane) with each other. The supply box 72A is disposed adjacent to the exhaust box 74A on the side opposite to the side of the exhaust box 74A adjacent to the transfer chamber 6A. The supply box 72B is disposed adjacent to exhaust box 74B on the side opposite to the side of the exhaust box 74B adjacent to the transfer chamber 6B.

In a top view, the thickness (the width in the short side direction) of the exhaust boxes 74A and 74B is smaller than the thickness of the supply boxes 72A and 72B. In other words, the supply boxes 72A and 72B near the transfer chambers 6A and 6B, protrude to the maintenance area side more than the exhaust boxes 74A and 74B away from the transfer chambers 6A and 6B. Since an integrated gas system and a large number of incidental facilities are arranged in the supply boxes 72A and 72B, the thickness may be larger than that of the exhaust boxes 74A and 74B in some cases. In such a case, by installing the exhaust boxes 74A and 74B on the front (housing) side, it is possible to secure a large maintenance area facing the maintenance doors 80A and 80B. That is, since the distance between the exhaust boxes 74A and 74B is larger than the distance between the supply boxes 72A and 72B in a top view, it is possible to secure a wider frontage of the maintenance space when installing the exhaust boxes 74A and 74B on the front side than when installing the supply boxes 72A and 72B on the front side. However, one skilled in the art may appreciate that the supply boxes 72A and 72B, the exhaust boxes 74A and 74B, and the controller boxes 76A and 76B can be arranged in that sequence from the front side, respectively if the supply boxes 72A and 72B are thinner than the exhaust boxes 74A and 74B or thin enough for securing a wide frontage.

As shown in FIG. 3, the final valves (the valves $40a$ and $40b$ positioned at the lowermost stage of the gas supply system) of the gas supply mechanisms 34A and 34B are arranged above the exhaust boxes 74A and 74B. Preferably, the final valves are arranged just above (directly above) the exhaust boxes 74A and 74B. With such a configuration, even if the supply boxes 72A and 72B are installed away from the housing side, it is possible to shorten the pipe length from the final valves to the inside of the process chamber. This makes it possible to improve the quality of film formation.

As shown in FIG. 5, the processing modules 3A and 3B are arranged plane-symmetrically with respect to the adjacent surface $S_1$ of the processing modules 3A and 3B. Further, the utility systems 70A and 70B are arranged plane-symmetrically with respect to the adjacent surface $S_1$. The reaction tubes 10A and 10B are installed so that each of the exhaust pipes 46A and 46B extends along the direction of the corner portion, i.e., so that the exhaust pipes 46A and 46B extend along the directions of the exhaust boxes 74A and 74B, respectively. In addition, pipes are arranged so that the pipe length from the final valves to the nozzles becomes substantially the same in the processing modules 3A and 3B. Moreover, as indicated by arrows in FIG. 5, the rotation directions of the wafers W are also opposite to each other in the process furnaces 4A and 4B.

Next, the maintenance of the processing apparatus 2 will be described. In the case where the inside of the transfer chamber 6A is circulation-purged by an inert gas, the interlock is set so that the maintenance door 80A cannot be opened. In addition, even when the oxygen concentration in the transfer chamber 6A is lower than the oxygen concentration at the atmospheric pressure, the interlock is set so that the maintenance door 80A cannot be opened. This also applies to the maintenance door 80B. Furthermore, when the maintenance doors 80A and 80B are opened, the interlock is set so that the gate valves 90A and 90B cannot be opened. In the case where the gate valves 90A and 90B are opened while opening the maintenance doors 80A and 80B, the entire processing apparatus 2 is brought into a maintenance mode and then the maintenance switch separately installed is turned on, whereby the interlock with respect to the gate valve 90A and 90B is released. This makes it possible to open the gate valves 90A and 90B.

When opening the maintenance door 80A, the air is caused to flow from the clean unit 60A into the transfer chamber 6A in order to raise the oxygen concentration in the transfer chamber 6A to an oxygen concentration in the atmosphere or more, preferably to an oxygen concentration in the atmosphere. At this time, the circulation purge in the transfer chamber 6A is released so that the pressure in the transfer chamber 6A does not become higher than the pressure in the transshipment chamber 8. The atmosphere in the transfer chamber 6A is exhausted to the outside of the transfer chamber 6A. The number of revolutions of a fan of the clean unit 60A is made lower than the number of revolutions during the circulation purge to control the inflow amount of the air into the transfer chamber 6A. By controlling in this way, it is possible to maintain the pressure in the transfer chamber 6A lower than the pressure in the transshipment chamber 8 while increasing the oxygen concentration in the transfer chamber 6A.

When the oxygen concentration in the transfer chamber 6A becomes equal to the oxygen concentration in the atmospheric pressure, the interlock is released and the maintenance door 80A can be opened. At this time, even if the oxygen concentration in the transfer chamber 6A is equal to the oxygen concentration in the atmospheric pressure, when the pressure in the transfer chamber 6A is higher than the pressure in the transshipment chamber 8, the interlock is set so that the maintenance door 80A cannot be opened. When the maintenance door 80A is opened, the number of revolutions of a fan of the clean unit 60A is set to be larger than the number of revolutions at the time of the circulation purge. More preferably, the number of revolutions of the fan of the clean unit 60A is maximized.

The maintenance in the transshipment chamber 8 is performed from the maintenance port 78C formed in the front of the transshipment chamber 8 and in the portion where the pod opener is not installed. The maintenance port 78C is configured to be opened and closed by a maintenance door. As described above, when the entire processing apparatus 2 is set in the maintenance mode, the gate valves 90A and 90B are opened and the maintenance can be performed from the side of the gate valves 90A and 90B. That is, the maintenance in the transshipment chamber 8 can be performed from the front side of the apparatus, from the back side of the apparatus, or from both sides.

Effect of the Present Embodiment

According to the present embodiment, one or more of the following effects may be obtained.

(1) By arranging from thinner boxes to thicker boxes from the housing side in the utility systems, it is possible to widen the maintenance area on the back side of the processing apparatus. Thus, it is possible to widely form the maintenance port on the back face of the transfer chamber, and thereby improve the maintainability. Furthermore, by widening the maintenance area on the back side of the processing apparatus, it is unnecessary to secure maintenance areas on both sides of the apparatus. This makes it possible to reduce the footprint of the apparatus.

(2) By installing the utility systems of the right and left processing modules on both outer side surfaces of the processing apparatus so as to face each other, it is possible to use the space on the back side of the apparatus as a maintenance area common to the left and right processing modules. For example, in a conventional apparatus, a supply box and an exhaust box may be installed on both ends of the back surface of the apparatus so as to face each other. In the case where two apparatuses having such a configuration are arranged side by side, the exhaust box of one of the apparatuses and the supply box of the other apparatus are adjacent to each other on the boundary line between the two apparatuses. On the other hand, according to the present embodiment, the utility systems are not arranged on the boundary line between the two processing modules. This makes it possible to secure a wide maintenance area.

(3) By installing the final valves of the gas supply system above the exhaust boxes, it is possible to shorten the pipe length from the final valves to the process chamber. That is, it is possible to suppress gas delay, flow rate fluctuation and the like at the time of gas supply, thereby improving the quality of film formation. Usually, the quality of film formation is influenced by gas supply conditions such as a gas flow rate and a gas pressure. Therefore, it is preferable to install the supply box near the housing in order to stably supply a gas into the reaction tube. However, in the present disclosure, by installing the final valves near the reaction tube, it is possible to arrange the supply boxes at a position distant from the housing without adversely affecting the quality of film formation. Furthermore, by disposing the exhaust boxes below the exhaust pipe extending from the processing container (reaction tube) and by arranging the final valves just above the exhaust pipe, it is possible to shorten the pipe length to the process chamber. Furthermore, by installing the final valves directly above the exhaust boxes, it becomes easy to perform maintenance such as replacement of the final valves and the like.

(4) By disposing the respective components line-symmetrically with respect to the boundary between the processing modules, it is possible to suppress variations in film formation quality between the left and right processing modules. In other words, by line-symmetrically arranging the respective components in the processing modules, the utility systems, the gas supply pipes and the exhaust pipes, the pipe length from the supply boxes to the reaction tube and the pipe length from the reaction tube to the exhaust boxes can be made substantially the same between the left and right processing modules. As a result, film formation can be performed under the same conditions in the left and right processing modules, and the quality of film formation can be made uniform. Therefore, it is possible to improve the productivity.

(5) By installing the maintenance doors on the boundary side of the two processing modules and allowing the maintenance doors to rotate toward the other processing module, the maintenance door can be opened substantively by 180 degrees in a manner such that opened one of the doors overlaps with another door closed, and the maintenance port can be widely formed on the back side of the transfer chamber. This makes it possible to improve the maintainability.

(6) It is possible to perform maintenance in the other processing module or the transshipment chamber while performing substrate processing in one processing module. As a result, maintenance can be performed without stopping the film-forming process. Therefore, it is possible to increase the operation rate of the apparatus and to improve the productivity.

(7) When opening the maintenance door of one processing module, the oxygen concentration in the transfer chamber is increased to the oxygen concentration at the atmospheric pressure while maintaining the pressure in the transfer chamber lower than the pressure in the transshipment chamber, whereby it is possible to suppress the inflow of the atmosphere from the transfer chamber toward the transshipment chamber. Furthermore, after the maintenance door is opened, the number of revolutions of the fan of the clean unit in the transfer chamber is made higher than that during the circulation purge, whereby even after the maintenance door is opened (even after the transfer chamber is opened to the atmosphere), it is possible to suppress the inflow of the atmosphere from the transfer chamber toward the transshipment chamber. With such a configuration, even if the maintenance door is opened in one of the processing modules, the other processing module can be kept running. That is, even when maintenance is performed in the transfer chamber, it is possible to maintain a clean atmosphere in the transshipment chamber, and it is possible to suppress an increase in the oxygen concentration in the transshipment chamber. Therefore, the stopped processing module can be subjected to maintenance without adversely affecting the processing module under operation. As a result, the maintenance of the other processing module can be performed in a state in which one processing module is operated. Therefore, there is no need to stop the operations of all the processing apparatuses at the time of maintenance. This makes it possible to improve the productivity.

The embodiment of the present disclosure has been concretely described above. However, the present disclosure is not limited to the above-described embodiment, and various modifications may be made without departing from the spirit thereof.

For example, in the above-described embodiment, there has been described an example in which the DCS gas is used as a precursor gas. However, the present disclosure is not limited to such an example. For example, as the precursor gas, in addition to the DCS gas, it may be possible to use an inorganic halosilane precursor gas such as a HCD ($Si_2Cl_6$: hexachlorodisilane) gas, a MCS ($SiH_3Cl$: monochlorosilane) gas, a TCS ($SiHCl_3$: trichlorosilane) gas or the like, a halogen-group-free amino (amine)-based silane precursor gas such as a 3DMAS ($Si[N(CH_3)_2]_3H$: trisdimethylaminosilane) gas, a BTBAS ($SiH_2[NH(C_4H_9)]_2$: bis-tertiary butyl aminosilane) gas or the like, and a halogen-group-free inorganic silane precursor gas such as a MS ($SiH_4$: monosilane) gas, a DS ($Si_2H_6$: disilane) gas or the like.

For example, in the above-described embodiment, there has been described an example in which the $SiO_2$ film is formed. However, the present disclosure is not limited to such an example. For example, alternatively or additionally, a SiN film, a SiON film, a SiOCN film, a SiOC film, a SiCN film, a SiBN film, a SiBCN film or the like may be formed by using a nitrogen (N)-containing gas (nitriding gas) such as an ammonia ($NH_3$) gas or the like, a carbon (C)-containing gas such as a propylene ($C_3H_6$) gas or the like, a boron (B)-containing gas such as a boron trichloride ($BCl_3$) gas or the like, and so forth. Even in the case of forming these films, film formation may be performed under the same processing conditions as in the above-described embodiment, and the effects as those of the above-described embodiment may be obtained.

Further, for example, the present disclosure may also be suitably applied to a case where a film containing a metal element such as titanium (Ti), zirconium (Zr), hafnium (Hf), tantalum (Ta), niobium (Nb), aluminum (Al), molybdenum (Mo), tungsten (W) or the like, i.e., a metal-based film is formed on the wafer W.

In the above-described embodiment, there has been described an example where a film is deposited on the wafer W. However, the present disclosure is not limited to such an example. For example, the present disclosure may also be suitably applied to a case where a process such as an oxidation process, a diffusion process, an annealing process, an etching process or the like is performed on a wafer W or a film formed on the wafer W.

In addition, the above-described embodiment and modifications may be used in combination as appropriate. The processing conditions at this time may be, for example, the same processing conditions as those of the above-described embodiment and modifications.

What is claimed is:

1. A substrate processing apparatus, comprising:
   a first process module including a first process container in which a substrate is processed;
   a second process module including a second process container in which a substrate is processed, the second process module being disposed adjacent to the first process module;
   a first utility system disposed adjacent to a back surface of the first process module and including:
      a first exhaust system configured to evacuate an inside of the first process container; and
      a first supply mechanism configured to supply a processing gas into the first process container; and
   a second utility system disposed adjacent to a back surface of the second process module and including:
      a second exhaust system configured to evacuate an inside of the second process container; and
      a second supply mechanism configured to supply a processing gas into the second process container,
   wherein the first exhaust system and the second exhaust system are disposed to face each other across a maintenance area, which is located behind a first part of the back surface of the first process module that is close to the second process module and behind a first part of the back surface of the second process module that is close to the first process module, and the first supply mechanism and the second supply mechanism are disposed to face each other across the maintenance area,
   wherein the first utility system further includes:
      a first supply casing formed in a box shape and enclosing the first supply mechanism; and
      a first exhaust casing formed in a box shape and enclosing the first exhaust system, and
   wherein the second utility system further includes:
      a second supply casing formed in a box shape and enclosing the second supply mechanism; and
      a second exhaust casing formed in a box shape and enclosing the second exhaust system, and
   wherein a maintenance port of the first exhaust casing, a maintenance port of the second exhaust casing, a maintenance port of the first supply casing, and a maintenance port of the second supply casing are disposed at sides of the maintenance area such that the maintenance port of the first exhaust casing and the maintenance port of the second exhaust casing face each other, and the maintenance port of the first supply casing and the maintenance port of the second supply casing face each other.

2. The apparatus of claim 1, wherein the first process module further includes a first transfer chamber disposed below the first process container, the substrate being loaded into and unloaded from the first process container,
wherein the second process module further includes a second transfer chamber disposed adjacent to the first transfer chamber, the substrate being loaded into and unloaded from the second process container, and
wherein a first maintenance door is installed on a back surface of the first transfer chamber, and a second maintenance door is installed on a back surface of the second transfer chamber.

3. The apparatus of claim 2, wherein the maintenance area constitutes an area for maintaining the first process container and the second process container.

4. The apparatus of claim 2, further comprising a transshipment chamber disposed adjacent to a front side of the first transfer chamber and a front side of the second transfer chamber, the substrate being transshipped to a first substrate holder in the first transfer chamber and a second substrate holder in the second transfer chamber from the transshipment chamber,
wherein the first maintenance door is configured to be opened when a pressure in the first transfer chamber is lower than a pressure in the transshipment chamber and an oxygen concentration in the first transfer chamber is equal to or higher than an oxygen concentration in the atmosphere.

5. The apparatus of claim 4, wherein a clean unit for supplying a clean air to the transshipment chamber is provided on a ceiling of the transshipment chamber,
a first gate valve and a second gate valve are installed on a boundary wall between the first transfer chamber and the transshipment chamber and on a boundary wall between the second transfer chamber and the transshipment chamber, respectively, and
an inert gas is circulated in the transshipment chamber as the clean air.

6. The apparatus of claim 2, wherein the first maintenance door and the second maintenance door are detachably pivoted by hinges, which are installed so as to be adjacent to each other in the vicinity of inner corners of the back surfaces of the first transfer chamber and the second transfer chamber.

7. The apparatus of claim 2, wherein the first transfer chamber includes:
a first clean unit installed on an outer side surface of the first transfer chamber and configured to supply a clean air or an inert gas; and
a first exhaust part installed on a side surface facing the first clean unit, and
wherein the second transfer chamber includes:
a second clean unit installed on an outer side surface of the second transfer chamber and configured to supply a clean air or an inert gas; and
a second exhaust part installed on a side surface facing the second clean unit,
the first transfer chamber is configured so that the clean air or the inert gas exhausted from the first transfer chamber by the first exhaust part is re-supplied from the first clean unit to the first transfer chamber, and
the second transfer chamber is configured so that the clean air or the inert gas exhausted from the second transfer chamber by the second exhaust part is re-supplied from the second clean unit to the second transfer chamber.

8. The apparatus of claim 1, wherein the first exhaust casing is disposed below an exhaust pipe extending from the first process container in a horizontal direction, and
wherein the second exhaust casing is disposed below an exhaust pipe extending from the second process container in a horizontal direction.

9. The apparatus of claim 1, wherein the first process module and the second process module are plane-symmetrically disposed with respect to a surface on which the first process module and the second process module are adjacent to each other, and
wherein the first utility system and the second utility system are plane-symmetrically disposed with respect to the surface on which the first process module and the second process module are adjacent to each other.

10. The apparatus of claim 1, wherein widths of portions of the first utility system and the second utility system that are close to front surfaces thereof are narrower than widths of portions of the first utility system and the second utility system that are close to back surfaces thereof, and
wherein a distance at the front surfaces between the first utility system and the second utility system is larger than a distance at the back surfaces between the first utility system and the second utility system.

11. The apparatus of claim 1, wherein the first process module and the second process module are disposed to have no gap therebetween.

12. The apparatus of claim 1, wherein the first exhaust casing accommodates at least an APC (Auto Pressure Controller) valve included in the first exhaust system, and
wherein the second exhaust casing accommodates at least an APC valve included in the second exhaust system.

13. The apparatus of claim 1, wherein the maintenance area is commonly used for a first transfer chamber of the first process module and a second transfer chamber of the second process module.

14. The apparatus of claim 1, wherein the maintenance area is adjacent to a back surface of a first transfer chamber of the first process module and a back surface of a second transfer chamber of the second process module, and is commonly used for the first transfer chamber and the second transfer chamber.

15. The apparatus of claim 1, wherein the maintenance area is adjacent to a back surface of a first maintenance door of a first transfer chamber of the first process module and a back surface of a second maintenance door of a second transfer chamber of the second process module, and is commonly used for opening/closing of the first maintenance door and the second maintenance door.

16. A method of manufacturing a semiconductor device using the substrate processing apparatus of claim 1, comprising:
processing the substrate by evacuating the inside of the first process container by the first exhaust system, while supplying a gas from the first supply mechanism into the first process container;
processing the substrate by evacuating the inside of the second process container by the second exhaust system, while supplying a gas from the second supply mechanism into the second process container; and performing maintenance of at least one selected from a group consisting of the first process module, the second process module, the first utility system, and the second utility system from the maintenance area.

17. The method of claim 16, wherein in the act of performing the maintenance, maintenance of a first transfer chamber disposed below the first process container in the first process module is performed, and the act of performing the maintenance includes:
  increasing an oxygen concentration in the first transfer chamber to an oxygen concentration in the atmosphere or more, while maintaining a pressure in the first transfer chamber lower than a pressure in a transshipment chamber; and
  opening a maintenance door formed on a back surface of the first transfer chamber.

* * * * *